US012368432B2

(12) United States Patent
Kasamatsu

(10) Patent No.: US 12,368,432 B2
(45) Date of Patent: Jul. 22, 2025

(54) ELASTIC WAVE RESONATOR, ELASTIC WAVE FILTER, DEMULTIPLEXER, AND COMMUNICATION DEVICE

(71) Applicant: KYOCERA Corporation, Kyoto (JP)

(72) Inventor: Naofumi Kasamatsu, Nara (JP)

(73) Assignee: KYOCERA Corporation, Kyoto (JP)

( * ) Notice: Subject to any disclaimer, the term of this patent is extended or adjusted under 35 U.S.C. 154(b) by 407 days.

(21) Appl. No.: 18/010,685

(22) PCT Filed: Jun. 22, 2021

(86) PCT No.: PCT/JP2021/023497
§ 371 (c)(1),
(2) Date: Dec. 15, 2022

(87) PCT Pub. No.: WO2021/261464
PCT Pub. Date: Dec. 30, 2021

(65) Prior Publication Data
US 2023/0308078 A1    Sep. 28, 2023

(30) Foreign Application Priority Data
Jun. 26, 2020    (JP) .................................. 2020-110833

(51) Int. Cl.
*H03H 9/00* (2006.01)
*H03H 9/02* (2006.01)
(Continued)

(52) U.S. Cl.
CPC ........ *H03H 9/1457* (2013.01); *H03H 9/0009* (2013.01); *H03H 9/02637* (2013.01);
(Continued)

(58) Field of Classification Search
None
See application file for complete search history.

(56) References Cited

U.S. PATENT DOCUMENTS 7,400,218 B2 *  7/2008  Kidoh .................. H03H 9/6436
333/133
2007/0069837 A1    3/2007  Nishimura et al.
(Continued)

FOREIGN PATENT DOCUMENTS

JP    63-135010 A    6/1988
JP    02-127809 A    5/1990
(Continued)

*Primary Examiner* — Idowu O Osifade
(74) *Attorney, Agent, or Firm* — Volpe Koenig

(57) ABSTRACT

An acoustic wave resonator includes a piezoelectric body and electrode fingers. The electrode fingers are positioned on the piezoelectric body and arrayed in a propagation direction of acoustic waves. The electrode fingers include a first and second electrode finger groups. Electrode fingers are formed between adjacent two of the electrode fingers of the other electrode group. A duty ratio of the electrode fingers of the first and second electrode finger groups is gradually changed along one of opposite directions specifying the propagation direction by first and second change amounts, respectively which are different, and in the opposite direction. In a region in which the electrode fingers are positioned, a pitch between the electrode fingers is changed to cancel an effect of a difference in the duty ratio of the electrode fingers on a difference in resonance frequency.

16 Claims, 7 Drawing Sheets

(51) Int. Cl.
  *H03H 9/145*  (2006.01)
  *H03H 9/25*   (2006.01)
  *H03H 9/64*   (2006.01)
  *H03H 9/72*   (2006.01)

(52) U.S. Cl.
  CPC .... *H03H 9/02866* (2013.01); *H03H 9/02992* (2013.01); *H03H 9/25* (2013.01); *H03H 9/6483* (2013.01); *H03H 9/725* (2013.01)

(56) References Cited

U.S. PATENT DOCUMENTS

2018/0026605 A1    1/2018   Ito et al.
2019/0379354 A1*   12/2019  Yasuda .................. H03H 9/059

FOREIGN PATENT DOCUMENTS

| JP | 09-266431 A    | 10/1997 |
| WO | 2005/050837 A1 | 6/2005  |
| WO | 2016/121818 A1 | 8/2016  |

* cited by examiner

US 12,368,432 B2

ELASTIC WAVE RESONATOR, ELASTIC WAVE FILTER, DEMULTIPLEXER, AND COMMUNICATION DEVICE

TECHNICAL FIELD

The present disclosure relates to an acoustic wave device.

BACKGROUND OF INVENTION

Patent Literature 1 describes an acoustic wave filter in which a plurality of interdigital transducers each having a specific resonance frequency is disposed on a piezoelectric substrate.

CITATION LIST

Patent Literature

Patent Literature 1: International Publication No. 2005/050837

SUMMARY

According to one aspect of the present disclosure, an acoustic wave resonator includes a piezoelectric body and a plurality of electrode fingers. The plurality of electrode fingers is positioned on the piezoelectric body and arrayed in a propagation direction of acoustic waves. The plurality of electrode fingers includes a first electrode finger group and a second electrode finger group of which electrode fingers are each formed between adjacent two of the electrode fingers of the first electrode finger group. A duty ratio of the electrode fingers of the first electrode finger group is gradually changed along one of opposite directions specifying the propagation direction by a first change amount, and a duty ratio of the electrode fingers of the second electrode finger group is gradually changed in the one of the opposite directions specifying the propagation direction by a second change amount different from the first change amount. In a region in which the plurality of electrode fingers is positioned, a pitch between the electrode fingers is changed to cancel an effect of a difference in the duty ratio of the electrode fingers on a difference in resonance frequency.

DESCRIPTION OF EMBODIMENTS

Embodiment 1

An embodiment according to the present disclosure will be described below with reference to the drawings. Note that the drawings referred to in the following description are schematic views and are not purported to exactly represent dimensional ratios between individual members on the drawings.

<Configuration of Resonator>

In this embodiment, an acoustic wave filter includes at least one acoustic wave resonator. In an example, the acoustic wave filter constitutes a ladder filter including a plurality of acoustic wave resonators connected in the form of a ladder. In this embodiment, the acoustic wave filter may include a plurality of acoustic wave resonators arranged in parallel in a direction orthogonal to propagation directions of acoustic waves in the acoustic wave resonators.

Figure 1:
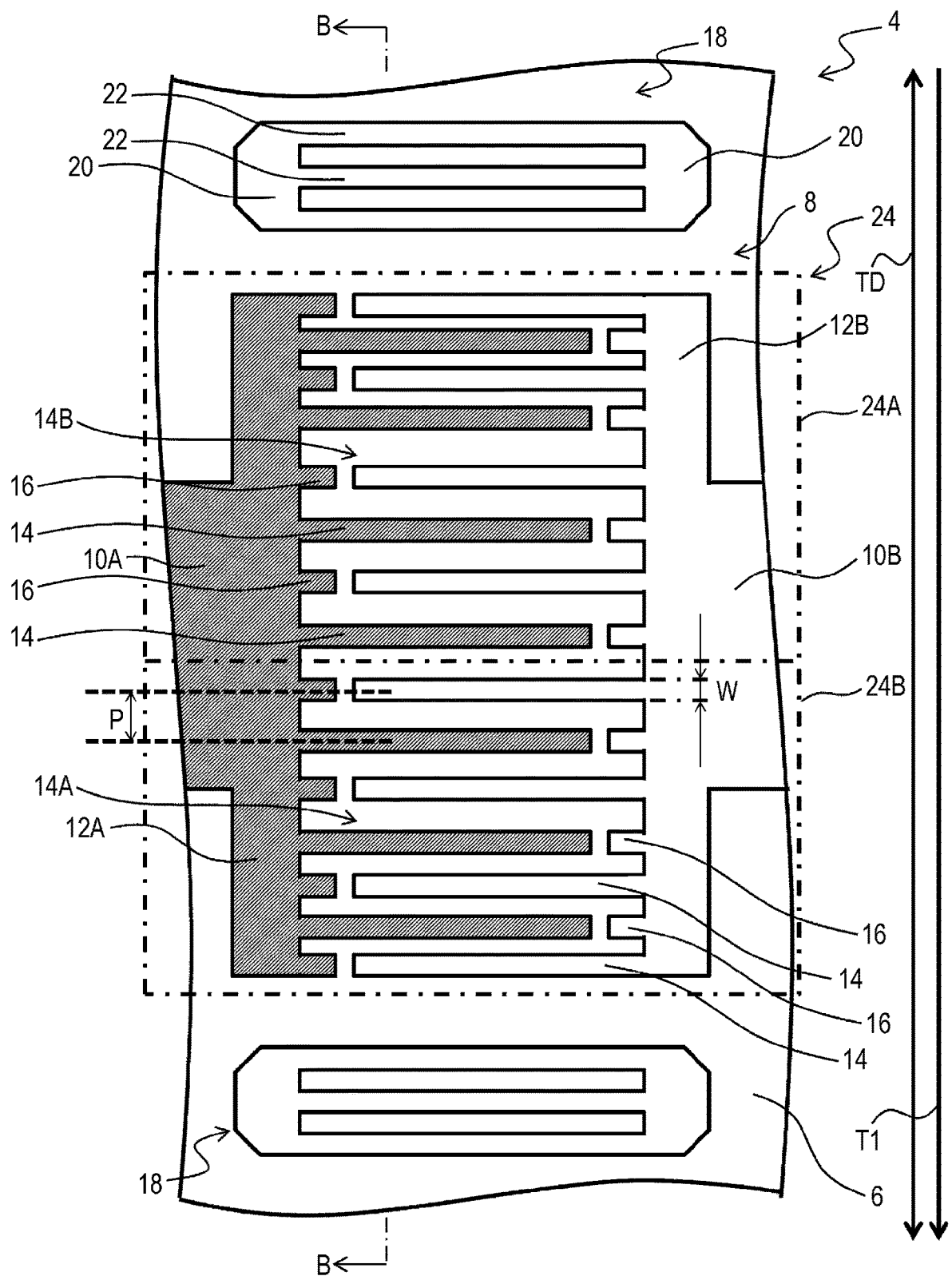
FIG. 1 is a schematic plan view of an acoustic wave resonator according to Embodiment 1 of the present disclosure.
Figure 2:
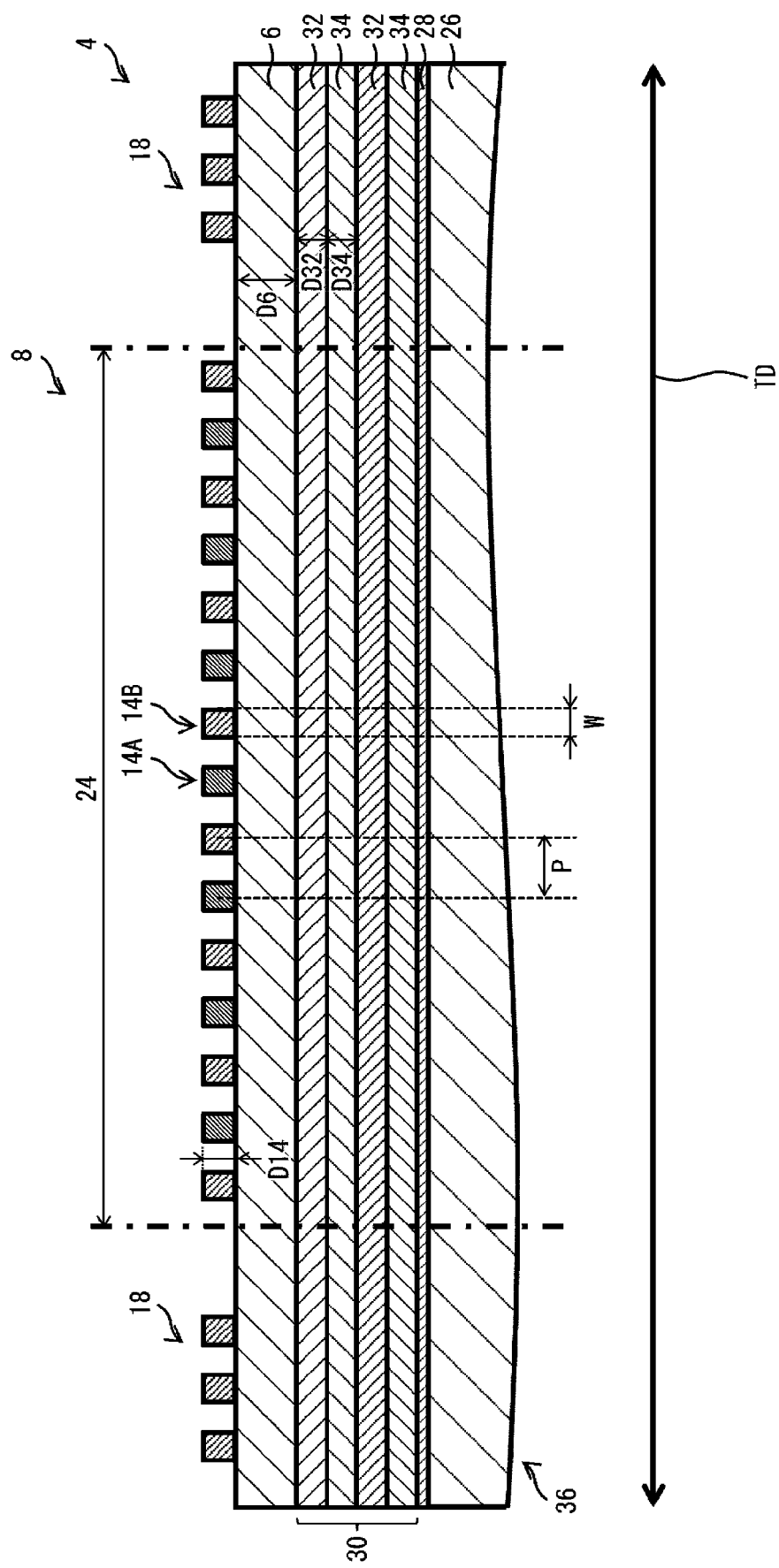
FIG. 2 is a schematic sectional view of the acoustic wave resonator according to Embodiment 1 of the present disclosure.

The acoustic wave resonator 4 according to this embodiment will be described in more detail below with reference to FIGS. 1 and 2. FIG. 1 is a schematic plan view of the acoustic wave resonator 4 according to this embodiment and is an enlarged plan view of a region A in FIG. 2. FIG. 2 is a schematic sectional view of the acoustic wave resonator 4 according to this embodiment and is a sectional view taken along a line B-B in FIG. 1 when viewed in a direction denoted by arrow. In this Description, a propagation direction TD of an acoustic wave in the acoustic wave resonator 4 is assumed, in plan views of the acoustic wave resonator 4 including FIG. 1, to be an up-down direction on the drawing sheet and, in sectional views of the acoustic wave resonator 4 including FIG. 2, to be a left-right direction on the drawing sheet. In this Description, the sectional views of the acoustic wave resonator 4 including FIG. 2 illustrate only members appearing in cross-sections and do not illustrate members positioned on a side farther away from the cross-section for simplicity of the drawings.

In this embodiment, as illustrated in FIGS. 1 and 2, the acoustic wave resonator 4 includes at least a piezoelectric body 6 and an IDT electrode 8 on the piezoelectric body 6. In the sectional views of the acoustic wave resonator 4 including FIG. 2 in this Description, the IDT electrode 8 is illustrated as being positioned on an upper side of the piezoelectric body 6 on the drawing sheet.

The piezoelectric body 6 is made of a piezoelectric material. For example, a single crystal of lithium tantalate (hereinafter also abbreviated to "LT"), lithium niobate, or the like may be used as the piezoelectric material. In the acoustic wave resonator 4, an acoustic wave propagating in the piezoelectric body 6 along the propagation direction TD is excited upon application of a voltage to a conductive layer including the IDT electrode 8 (described later). In this embodiment, as illustrated in FIG. 2, the piezoelectric body 6 may have a constant thickness D6. In this Description, the wording "constant thickness" does not always indicate that the thickness is exactly constant, and it accompanies with an allowance of a slight variation within such an extent as not significantly affecting the characteristics of the acoustic wave propagating in the piezoelectric body 6.

<Details of IDT Electrode and Reflector>

The IDT electrode 8 includes a pair of comb-shaped electrodes 10. In this embodiment, as illustrated in FIG. 1, the pair of comb-shaped electrodes 10 is given by a first comb-shaped electrode 10A and a second comb-shaped electrode 10B. In this Description, the first comb-shaped electrode 10A is denoted by hatching in the plan views of the acoustic wave resonator 4 including FIG. 1 for easier visual recognition. Each of the comb-shaped electrodes 10 includes, for example, a busbar 12, a plurality of electrode fingers 14 extending from the busbar 12, and a plurality of dummy electrodes 16 each positioned between adjacent two of the electrode fingers 14 and protruding from the busbar 12. The pair of comb-shaped electrodes 10 is arranged such that the electrode fingers 14 of the comb-shaped electrodes are interdigitated with each other.

The busbar 12 has a substantially constant width and is formed substantially along the propagation direction TD. The busbars 12 disposed in pair are arranged opposite to each other in the direction substantially orthogonal to the propagation direction TD. More specifically, the busbars 12 are given by a first busbar 12A formed as the busbar for the first comb-shaped electrode 10A and a second busbar 12B formed as the busbar for the second comb-shaped electrode 10B and arranged opposite to the first busbar 12A. Each busbar 12 may vary in width or may be formed obliquely relative to the propagation direction TD within such an extent as not significantly affecting the acoustic wave propagating in the piezoelectric body 6.

The electrode fingers 14 are formed to extend substantially along a width direction of the busbar 12. In each of the comb-shaped electrodes 10, the electrode fingers 14 are arrayed in the propagation direction TD. The electrode fingers 14 extending from one busbar 12 and the electrode fingers 14 extending from the other busbar 12 are alternately arranged in the propagation direction TD.

The number of the electrode fingers 14 is not limited to the number illustrated in FIG. 1 and may be designed as appropriate depending on the characteristics demanded for the acoustic wave resonator 4. Lengths of the electrode fingers 14 may be substantially constant as illustrated in FIG. 1 or may be different at positions along the propagation direction TD for the so-called apotization. In part of the IDT electrode 8, the electrode fingers 14 may be partially "thinned away". Stated in another way, the IDT electrode 8 may include in its part a region where the electrode fingers 14 are partially not formed.

The dummy electrodes 16 protrude substantially along the width direction of the busbar 12. The dummy electrodes 16 protruding from one busbar 12 are positioned to face tips of the electrode fingers 14 protruding from the other busbar 12 in the direction orthogonal to the propagation direction TD with a gap interposed therebetween. Note that the acoustic wave resonator 4 according to this embodiment may not need to include the dummy electrodes 16.

The acoustic wave resonator 4 further includes a pair of reflectors 18 positioned on the piezoelectric body 6 at opposite ends thereof in the propagation direction TD on both sides of the electrode fingers 14. Each of the reflectors 18 includes a plurality of strip electrodes 22 extending from a pair of busbars 20 that is positioned opposite to each other. The reflectors 18 may be in an electrically floating state or may be given with a reference potential. The IDT electrode 8 and the reflectors 18 may be positioned in the same layer and/or may be included in a conductive layer. The IDT electrode 8 and the reflectors 18 are made of a metallic material and may be made of, for example, an alloy containing Al as a main component. The number, the shape, and so on of the strip electrodes 22 of each reflector 18 are not limited to those illustrated in FIG. 1 and may be designed as appropriate depending on the characteristics demanded for the acoustic wave resonator 4 like the electrode fingers 14.

In this Description, the term "electrode fingers" indicates not only the plurality of electrode fingers 14 of the IDT electrode 8, but also the plurality of strip electrodes 22 of each reflector 18 when the acoustic wave resonator 4 includes the reflectors 18.

In the acoustic wave resonator 4 according to this embodiment. as illustrated in FIGS. 1 and 2, the plurality of electrode fingers 14 of the IDT electrode 8 is positioned within an electrode-finger placement region 24 when viewed in plan. In this embodiment, the electrode-finger placement region 24 includes at least one first region 24A and at least one second region 24B.

Here, as illustrated in FIG. 1, one of opposite directions specifying the propagation direction TD is defined as a first direction T1. In FIG. 1, of the opposite directions specifying the propagation direction TD, the first direction T1 is defined as a direction toward a lower side from an upper side on the drawing sheet of FIG. 1. In this embodiment, as illustrated in FIG. 1, the electrode-finger placement region 24 includes the second region 24B at a position closer to a head side in the first direction T1 than the first region 24A. For instance, as illustrated in FIG. 1, one half of the electrode fingers 14 may be formed in the first region 24A, and the other half may be formed in the second region 24B.

<Duty Ratio of Electrode Fingers>

In the acoustic wave resonator 4 according to this embodiment. as illustrated in FIGS. 1 and 2, the plurality of electrode fingers 14 of the IDT electrode 8 includes a first electrode finger group 14A and a second electrode finger group 14B. The first electrode finger group 14A extends from the first bus bar 12A, and the second electrode finger group 14B extends from the second busbar 12B. Thus, as illustrated in FIGS. 1 and 2, the electrode fingers of the second electrode finger group 14B are each formed between adjacent two of the electrode fingers of the first electrode finger group 14A.

In this embodiment, the acoustic wave resonator 4 is featured in a duty ratio of the electrode fingers 14. The duty ratio of the electrode fingers 14 is expressed as a value resulting from dividing a width W of certain one of the electrode fingers 14 by a pitch between the one electrode finger 14 and another adjacent electrode finger 14.

In this embodiment, the duty ratio of at least part of the electrode fingers 14 is gradually changed along one of the opposite directions specifying the propagation direction TD. More specifically, in this embodiment, the duty ratio of at least part of the electrode fingers 14 of the first electrode finger group 14A among all the electrode fingers 14 is gradually changed along the one of the opposite directions specifying the propagation direction TD by a first change amount. The duty ratio of at least part of the electrode fingers 14 of the second electrode finger group 14B among all the electrode fingers 14 is gradually changed along the one of the opposite directions specifying the propagation direction TD by a second change amount different from the first change amount.

Generally, of acoustic waves propagating in the piezoelectric body 6, a resonance frequency of the acoustic wave excited by the acoustic wave resonator 4 varies depending on the duty ratio of the electrode fingers 14. For instance, as the duty ratio of the electrode fingers 14 reduces, the resonance frequency increases. In the acoustic wave resonator 4, therefore, when parameters contributing to the above-mentioned resonance frequency except for the duty ratio of the electrode fingers 14 are substantially constant at any positions on the acoustic wave resonator 4, a difference generates in the resonance frequency depending on the position on the acoustic wave resonator 4.

In this Description, the term "resonance frequency" indicates a resonance frequency of an acoustic wave excited in a main resonance mode among acoustic waves excited by the acoustic wave resonator 4 and does not indicate a resonance frequency of an acoustic wave excited in a sub-resonance or spurious mode.

<Examples of Duty Ratio of Electrode Fingers>

Figure 3:
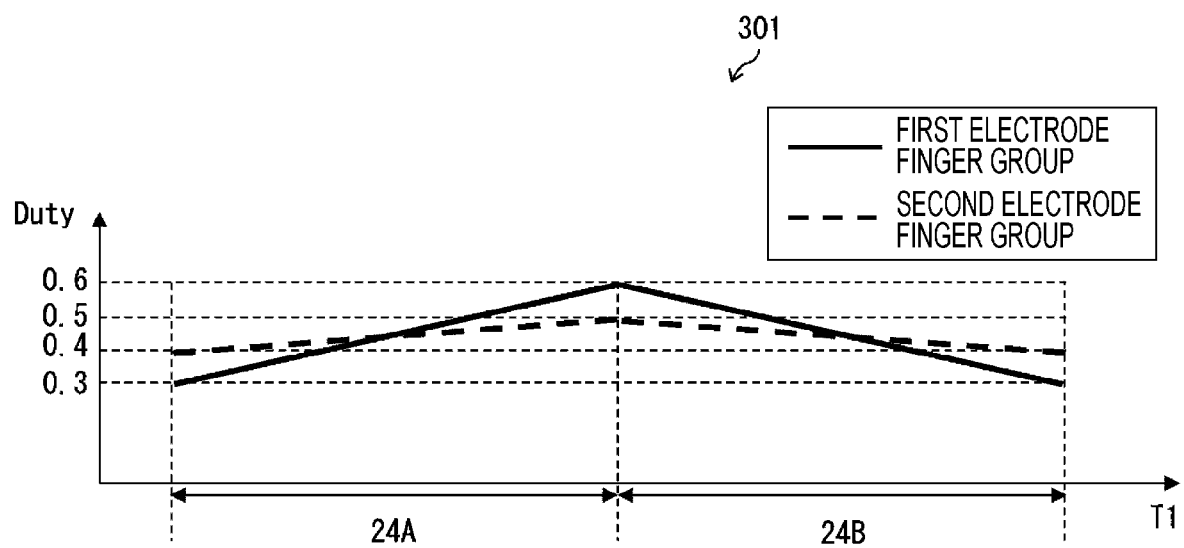
FIG. 3 depicts graphs each representing change in a duty ratio of electrode fingers of the acoustic wave resonator according to Embodiment 1 of the present disclosure.
Figure 3:
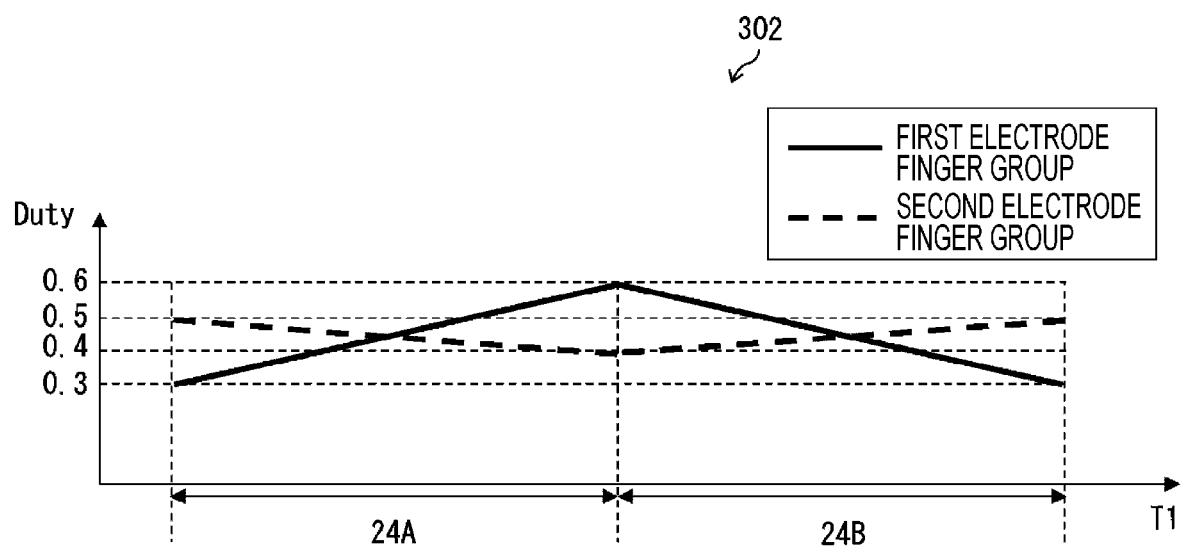

Examples of changes in the duty ratio of the electrode fingers 14 of the first electrode finger group 14A and the second electrode finger group 14B in this embodiment are described in more detail with reference to FIG. 3. FIG. 3 depicts graphs each representing, for the electrode fingers 14 of the acoustic wave resonator 4 according to this embodiment, a relationship between the position on the acoustic wave resonator 4 in the propagation direction TD and the duty ratio of the electrode fingers 14. In each graph of FIG. 3, a horizontal axis denotes the position on the acoustic wave resonator 4 in the propagation direction TD at which the electrode finger 14 is formed, and a vertical axis denotes the duty ratio of the electrode finger 14 at that position. "24A" and "24B" denoted along the horizontal axis correspond to locations where the first region 24A and the second region 24B are formed.

In each graph of FIG. 3, a positive direction of the horizontal axis corresponds to the first direction T1. Furthermore, In each graph of FIG. 3, a solid line represents the duty ratio of the electrode fingers 14 of the first electrode finger group 14A, and a dashed line represents the duty ratio of the electrode fingers 14 of the second electrode finger group 14B.

Because the duty ratio of the electrode fingers is determined for each of the electrode fingers, values of the duty ratio are to be discretely plotted in each graph of FIG. 3 in a strict sense. In this Description, however, the change in the duty ratio of the electrode fingers 14 is illustrated on an assumption, for simplicity of the drawing, that the duty ratio of the electrode fingers 14 in each of the first electrode finger group 14A and the second electrode finger group 14B is changed continuously.

In the acoustic wave resonator 4 according to this embodiment, as illustrated in a graph 301 of FIG. 3 by way of example, the duty ratio of the electrode fingers 14 of the first electrode finger group 14A positioned in the first region 24A increases gradually from 0.3 to 0.6 along the first direction T1. In the acoustic wave resonator 4, the duty ratio of the electrode fingers 14 of the second electrode finger group 14B positioned in the first region 24A increases gradually from 0.4 to 0.5 along the first direction T1.

On the other hand, in the acoustic wave resonator 4 according to this embodiment, as illustrated in FIG. 3 by way of example, the duty ratio of the electrode fingers 14 of the first electrode finger group 14A positioned in the second region 24B decreases gradually from 0.6 to 0.3 along the first direction T1. In the acoustic wave resonator 4, the duty ratio of the electrode fingers 14 of the second electrode finger group 14B positioned in the second region 24B decreases gradually from 0.5 to 0.4 along the first direction T1.

Thus, in the first region 24A of the acoustic wave resonator 4, the duty ratio of the electrode fingers 14 of the first electrode finger group 14A increases gradually along the first direction T1 by a larger change amount than that of the electrode fingers 14 of the second electrode finger group 14B. In the second region 24B of the acoustic wave resonator 4, the duty ratio of the electrode fingers 14 of the first electrode finger group 14A decreases gradually along the first direction T1 by a larger change amount than that of the electrode fingers 14 of the second electrode finger group 14B.

The change in the duty ratio of the electrode fingers 14 of the acoustic wave resonator 4 according to this embodiment is not limited to the example illustrated in the graph 301 of FIG. 3. As another example, in the acoustic wave resonator 4 according to this embodiment, the duty ratio of the electrode fingers 14 of the second electrode finger group 14B positioned in the first region 24A may decrease gradually from 0.5 to 0.4 along the first direction T1 as illustrated in a graph 302 of FIG. 3. In such a case, the duty ratio of the electrode fingers 14 of the second electrode finger group 14B positioned in the second region 24B may decrease gradually from 0.4 to 0.5 along the first direction T1 as illustrated in the graph 302 of FIG. 3. In the acoustic wave resonators 4 corresponding to the graphs 301 and 302 of FIG. 3, changes in the duty ratio of the electrode fingers 14 of the first electrode finger group 14A may be the same.

As described above, in each of the first region 24A and the second region 24B in the acoustic wave resonator 4 according to this embodiment, the change in the duty ratio of the electrode fingers 14 along the one of the opposite directions specifying the propagation direction TD is different between the first electrode finger group 14A and the second electrode finger group 14B.

<Pitch Between Electrode Fingers>

The plurality of electrode fingers 14 is arranged at a certain pitch P therebetween. The resonance frequency of the acoustic wave excited by the acoustic wave resonator 4 depends on the pitch P between the electrode fingers 14. Generally, the resonance frequency of the acoustic wave excited by the acoustic wave resonator 4 increases with narrowing of the pitch P between the electrode fingers 14.

In this embodiment, the pitch P is changed to cancel an effect of a difference in the duty ratio of the electrode fingers 14 on a difference in the resonance frequency in the electrode-finger placement region 24. Stated in another way, in the acoustic wave resonator 4 according to this embodiment, a difference between resonance frequencies oscillated at different positions in the electrode-finger placement region 24 is smaller than when the pitch P is set to be substantially constant at all the positions.

As a result, the frequencies of acoustic waves excited at different positions on the piezoelectric body 6 become more uniform, and the characteristics of the acoustic wave resonator 4 are improved. The pitch P between the electrode fingers 14 can be easily determined with a simulation from the difference in the duty ratio of the electrode fingers 14.

In this embodiment, the resonance frequencies oscillated in at least part of the electrode-finger placement region 24 may be the same. The resonance frequencies oscillated in 80% or more of the electrode-finger placement region 24 may be the same. As a result, the frequencies of acoustic waves excited at different positions on the piezoelectric body 6 become more uniform, and the characteristics of the acoustic wave resonator 4 are improved.

In this Description, the wording "frequencies are the same" does not always indicate that the frequencies are the same in a strict sense. For instance, a slight difference between the resonance frequencies of the acoustic waves in the main oscillation mode propagating through the piezoelectric body 6 in the electrode-finger placement region 24 is allowed within such an extent as not significantly affecting the characteristics of the acoustic wave resonator 4.

In more detail, a numerical value for use in determining that "resonance frequencies in a certain region are the same" may be given as a value (dfr) resulting from dividing a difference between the resonance frequencies in the above-mentioned region by a desired resonance frequency and multiplying a divided value by 100. When the dfr is −0.856 or more and 0.856 or less, for example, it may be determined that "the resonance frequencies in the certain region are the same".

When the dfr value satisfies the above-mentioned range, generation of spurious waves caused by the difference between the resonance frequencies at the different positions can be suppressed in the frequency characteristics of the acoustic wave resonator 4. Moreover, in this embodiment, when the dfr value satisfies the above-mentioned range, an absolute value of the difference between the resonance frequencies in the above-mentioned region is 50 MHz or smaller.

When the dfr value is −1.028 or 1.028, the generation of the spurious waves is confirmed. In such a case, the absolute value of the difference between the resonance frequencies in the above-mentioned region corresponds to 60 MHz in this embodiment.

Here, a value of the pitch P may be, for example, from about 0.70 nm to about 0.75 nm. The thickness D6 of the piezoelectric body 6 may be equal to or smaller than the pitch P between any adjacent two of the electrode fingers 14. This enables the resonance frequency to be increased by the acoustic wave resonator 4 including the electrode fingers 14 with a relatively wide pitch.

While the thickness D6 of the piezoelectric body 6 is not limited to a particular value, it is, for example, from about 0.4 times to about 1.2 times any of a first pitch PA and a second pitch PB in this embodiment. For instance, the thickness D6 of the piezoelectric body 6 is from about 0.28 μm to about 0.9 μm.

In this embodiment, thicknesses D14 of the electrode fingers 14 may be the same in the electrode-finger placement region 24. The thicknesses D14 of the electrode fingers 14 are, for example, about 0.16 times the pitch P between any adjacent two of the electrode fingers 14. Thicknesses of the strip electrodes 22 of the reflector 18 may be the same as those of the electrode fingers 14.

<Fixation Substrate>

Returning to the explanation of the configuration of the acoustic wave resonator 4, as illustrated in FIG. 2, the acoustic wave resonator 4 further includes a support substrate 26 on an opposite side to the IDT electrode 8 with the piezoelectric body 6 interposed therebetween. In this embodiment, an effect of the support substrate 26 on the characteristics of the acoustic waves propagating in the piezoelectric body 6 is sufficiently small. Therefore, a material and a size of the support substrate 26 may be selected in design as appropriate. For instance, the support substrate 26 may contain an insulating material and may contain resin or ceramic. A thickness of the support substrate 26 is, for example, greater than the thickness D6 of the piezoelectric body 6. To further reduce an effect on the characteristics of the acoustic waves with a variation in temperature, the support substrate 26 may be made of a material with a lower linear expansion coefficient than that of the piezoelectric body 6.

In addition, the acoustic wave resonator 4 includes a reflective multilayer film 30 between the piezoelectric body 6 and the support substrate 26. The acoustic wave resonator 4 may include an adhesive layer 28 between the reflective multilayer film 30 and the support substrate 26. A laminate including the piezoelectric body 6, the support substrate 26, the adhesive layer 28, and the reflective multilayer film 30 is referred to as a fixation substrate 36 in some cases.

The adhesive layer 28 is inserted to increase adhesivity between the support substrate 26 and the reflective multilayer film 30, and an effect of the adhesive layer 28 on the characteristics of the acoustic waves propagating in the piezoelectric body 6 is sufficiently small.

The reflective multilayer film 30 includes a first layer 32 and a second layer 34 that are alternately laminated. A material of the first layer 32 has a lower acoustic impedance than that of the second layer 34. As a result, a reflectance of acoustic waves increases at the interface between the first layer 32 and the second layer 34, whereby leak of the acoustic waves propagating in the piezoelectric body 6 to the outside of the acoustic wave filter is reduced.

The first layer 32 may be made of, for example, silicon dioxide ($SiO_2$). The second layer 34 may be made of, for example, hafnium oxide ($HfO_2$). In another example, the second layer 34 may be made of any of tantalum pentoxide ($Ta_2O_5$), zirconium dioxide ($ZrO_2$), titanium oxide ($TiO_2$), and magnesium oxide (MgO).

The reflective multilayer film 30 just needs to include at least one first layer 32 and at least one second layer 34, and the number of layers is an appropriately selectable matter. A total layer value of the first layer 32 and the second layer 34 may be odd or even. Among the layers of the reflective multilayer film 30, the layer in contact with the piezoelectric body 6 is the first layer 32, but the layer in contact with the adhesive layer 28 may be any of the first layer 32 and the second layer 34.

The reflective multilayer film 30 may include the first layer 32 and the second layer 34 in total number of, for example, three or more and 12 or less. However, the reflective multilayer film 30 may include only one first layer 32 and only one second layer 34. The adhesive layer 28 may also be formed between the first layer 32 and the second layer 34 adjacent to each other from the viewpoint of increasing adhesivity between the layers of the reflective multilayer film 30 and avoiding diffusion of the acoustic waves in the reflective multilayer film 30.

As illustrated in FIG. 2, each first layer 32 may have a constant thickness D32, and each second layer 34 may have a constant thickness D34. The thickness D32 and the thickness D34 may be, for example, from about 0.25 times to 2 times the pitch P between any adjacent two of the electrode fingers 14.

<Characteristic Change Caused by Difference in Pitch and Duty Ratio>

To evaluate the characteristics of the acoustic wave resonator 4 according to this embodiment, the characteristics are described in comparison with those of an acoustic wave resonator according to Comparative Example. In the acoustic wave resonator according to Comparative Example, the duty ratios of all the electrode fingers 14 are set to a constant value 0.55, and the pitches P between all adjacent twos of the electrode fingers 14 are set to be constant. Except for the above-mentioned points, the acoustic wave resonator according to Comparative Example has the same configuration as the acoustic wave resonator 4 according to this embodiment.

Figure 4:
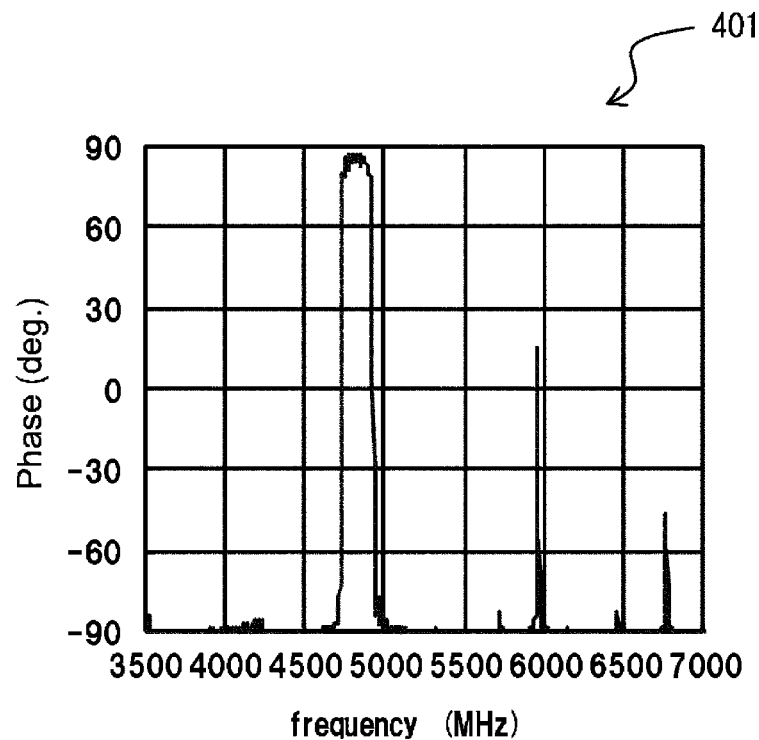
FIG. 4 depicts graphs representing characteristics of the acoustic wave resonator according to Embodiment 1 of the present disclosure and characteristics of an acoustic wave resonator according to Comparative Example for comparison.
Figure 4:
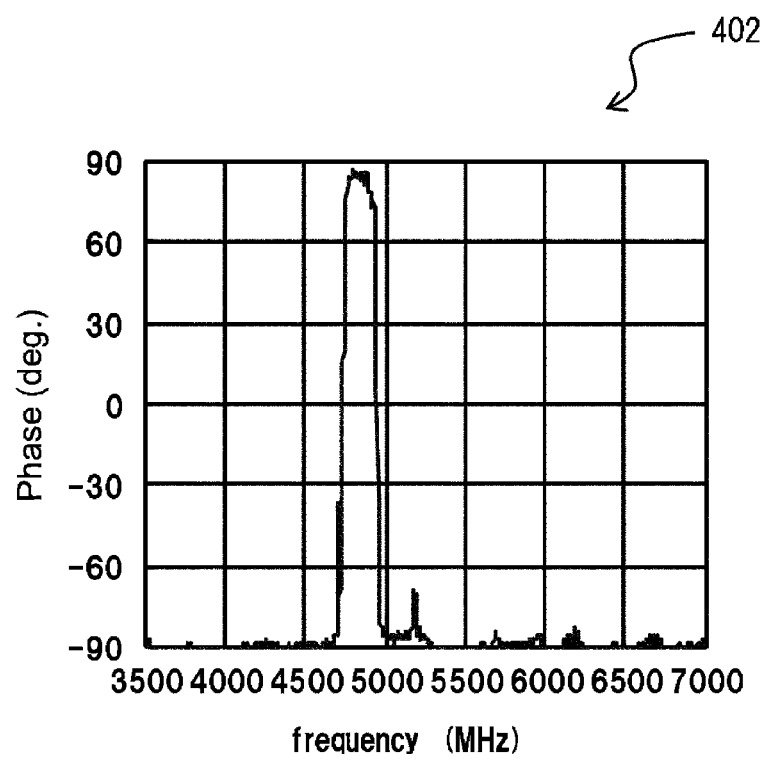

FIG. 4 depicts graphs representing characteristics of acoustic waves excited in the acoustic wave resonators according to Comparative Example and this embodiment and indicating the phase of an impedance per frequency in both the acoustic wave resonators. In other words, the graphs of FIG. 4 indicate the intensity of the acoustic waves oscillated in the acoustic wave resonators per frequency. In each graph of FIG. 4, a vertical axis denotes the phase (unit: deg), and a horizontal axis denotes the frequency (unit: MHz).

A graph 401 of FIG. 4 represents the calculation result with a simulation for the acoustic wave resonator according to Comparative Example. A graph 402 of FIG. 4 represents the calculation result with a simulation for the acoustic wave resonator 4 according to this embodiment in which the change in the duty ratio of the electrode fingers 14 is depicted in the graph 301 of FIG. 3. The pitch P between the electrode fingers 14 of the acoustic wave resonator 4 having the characteristics depicted in the graph 402 of FIG. 4 is determined to provide the resonance frequencies equal to each other in contrast with the acoustic wave resonator having the characteristics depicted in the graph 401 of FIG. 4. Accordingly, as depicted in the graphs of FIG. 4, the acoustic wave resonator according to each of Comparative Example and this embodiment oscillates at a frequency in the main oscillation mode near 4700 MHz As will be seen from the graph 401 of FIG. 4, in the acoustic wave resonator according to Comparative Example, spurious waves excited at frequencies near 6000 MHz and 6750 MHz generate in addition to the frequency in the main resonance mode. On the other hand, as will be seen from the graph 402 of FIG. 4, in the acoustic wave resonator according to this embodiment, the intensity of the spurious waves is reduced in comparison with that in the acoustic wave resonator according to Comparative Example.

Generally, in an acoustic wave resonator, the frequency of an acoustic wave excited in the spurious mode exhibits different dependency on changes in duty ratio and pitch of electrode fingers from the frequencies excited in the main resonance and anti-resonance modes. In the acoustic wave resonator, therefore, when the pitch and the duty ratio of the electrode fingers are both changed while the frequency of the main resonance is kept constant, the frequency of the acoustic wave excited in the spurious mode varies.

In the acoustic wave resonator 4 according to this embodiment, the duty ratio of the electrode fingers 14 is changed in the electrode-finger placement region 24. Stated in another way, in the acoustic wave resonator 4 according to this embodiment, a resonated spurious frequency is different depending on a position in the electrode-finger placement region 24. Accordingly, comparing with the acoustic wave resonator including the electrode fingers with the constant duty ratio, the acoustic wave resonator 4 according to this embodiment can suppress resonated spurious frequencies from concentrating on a certain value and can reduce the intensity of spurious waves as a whole.

In the acoustic wave resonator 4 according to this embodiment, a difference in main resonance frequency is reduced in addition to the change in the duty ratio of the electrode fingers 14 in the electrode-finger placement region 24. Accordingly, as depicted in the graph 402 of FIG. 4, the intensity of the spurious waves can be reduced while uniformity in the main resonance frequency is maintained. Hence the characteristics can be improved.

In the acoustic wave resonator 4 according to this embodiment, the change amount of the duty ratio of the electrode fingers 14 along the first direction T1 is different between the first electrode finger group 14A and the second electrode finger group 14B. Stated in another way, in the acoustic wave resonator 4 according to this embodiment, there is a difference in rule of the change in the duty ratio for the electrode fingers 14 adjacent to each other in the propagation direction TD.

Accordingly, in the acoustic wave resonator 4 according to this embodiment, the difference in the duty ratio can be more effectively given for the electrode fingers 14 adjacent to each other in the propagation direction TD. Moreover, in the acoustic wave resonator 4 according to this embodiment, a variation in the resonance frequency caused by the change in the duty ratio of the electrode fingers 14 can be relatively easily made more uniform with design of the pitch P between the electrode fingers 14.

In this embodiment, as illustrated in FIG. 3, a maximum value of the duty ratio of the electrode fingers 14 of the first electrode finger group 14A may be different from that of the duty ratio of the electrode fingers 14 of the second electrode finger group 14B. More specifically, in this embodiment, the maximum value of the duty ratio of the electrode fingers 14 of the first electrode finger group 14A may be greater than that of the duty ratio of the electrode fingers 14 of the second electrode finger group 14B as illustrated in FIG. 3.

In this embodiment, as illustrated in FIG. 3, a minimum value of the duty ratio of the electrode fingers 14 of the first electrode finger group 14A may be different from that of the duty ratio of the electrode fingers 14 of the second electrode finger group 14B. More specifically, in this embodiment, the minimum value of the duty ratio of the electrode fingers 14 of the first electrode finger group 14A may be smaller than that of the duty ratio of the electrode fingers 14 of the second electrode finger group 14B as illustrated in FIG. 3.

In this embodiment, as illustrated in FIG. 3, a difference between the maximum value and the minimum value of the duty ratio of the electrode fingers 14 of the first electrode finger group 14A may be different from that between the maximum value and the minimum value of the duty ratio of the electrode fingers 14 of the second electrode finger group 14B.

With the above-described configuration, in the acoustic wave resonator 4 according to this embodiment, the difference in the duty ratio can be more effectively given for the electrode fingers 14 adjacent to each other in the propagation direction TD.

Embodiment 2

<Duty Ratio of Strip Electrodes of Reflector>

Figure 5:
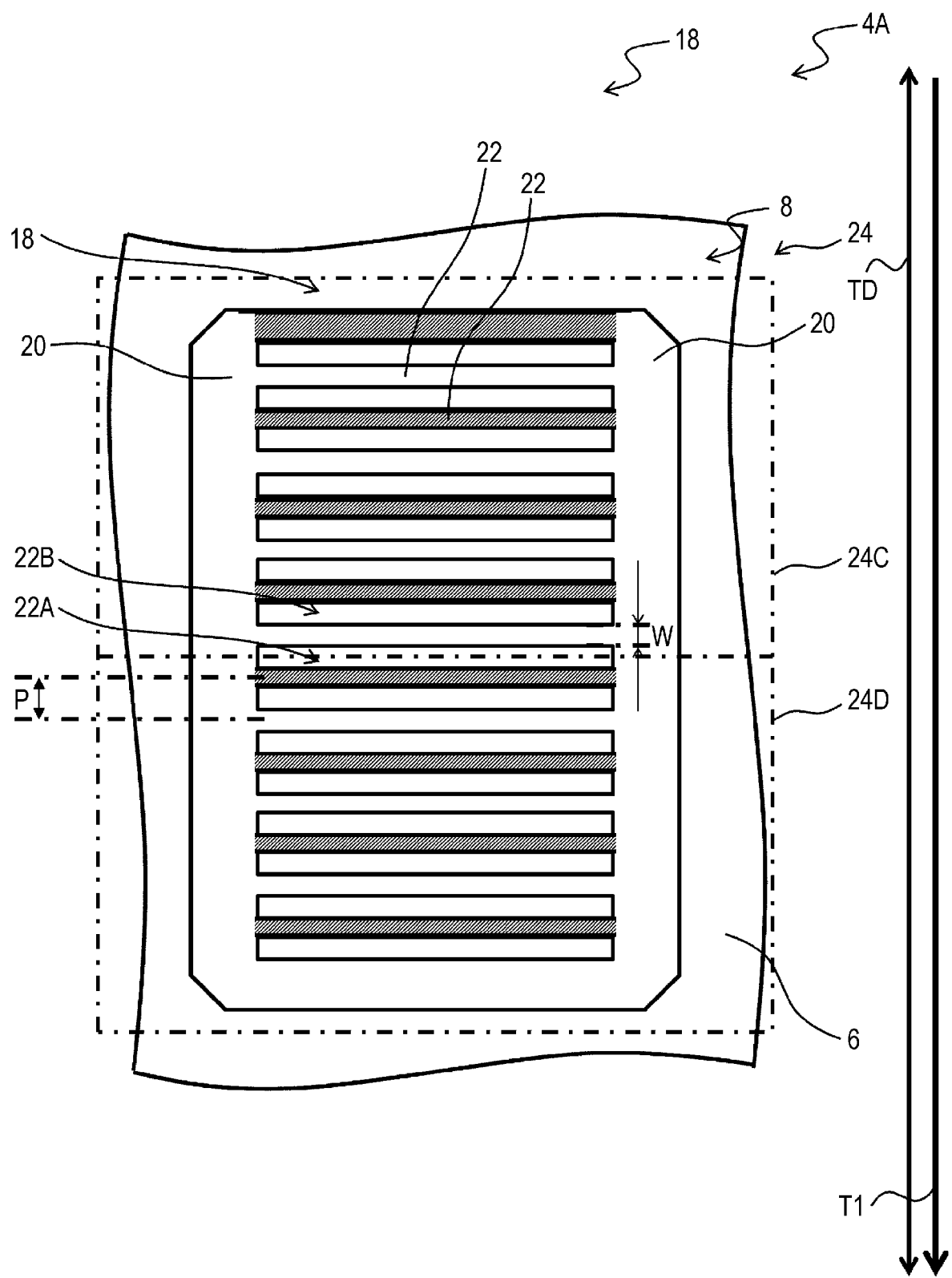
FIG. 5 is a schematic plan view illustrating, in an enlarged scale, the vicinity of a reflector in an acoustic wave resonator according to Embodiment 2 of the present disclosure.

FIG. 5 is a schematic plan view illustrating, in an enlarged scale, the vicinity of a reflector 18 in an acoustic wave resonator 4A according to Embodiment 2. In this embodiment, the acoustic wave resonator 4A may have, by way of example, the same configuration as the acoustic wave resonator 4 according to the above embodiment except for a configuration of the reflector 18. The reflector 18 illustrated in FIG. 5 is different from the reflector 18 illustrated in FIG. 1 and so on in the number of strip electrodes 22. However, the acoustic wave resonator 4 according to the above embodiment may also include the reflector 18 with the strip electrodes 22 in the same number as the reflector 18 illustrated in FIG. 5.

In the acoustic wave resonator 4A according to this embodiment, as illustrated in FIG. 5, the strip electrodes 22 are positioned within an electrode-finger placement region 24 when viewed in plan. In this embodiment, the electrode-finger placement region 24 includes at least one first region 24C and at least one second region 24D.

Here, as illustrated in FIG. 5, one of opposite directions specifying a propagation direction TD is defined as a first direction T1. Also in FIG. 5, the first direction T1 is defined as, of the opposite directions specifying the propagation direction TD, the one toward a lower side from an upper side on the drawing sheet of FIG. 5. In this embodiment, as illustrated in FIG. 5, the electrode-finger placement region 24 includes the second region 24D at a position closer to a head side in the first direction T1 than the first region 24C. For instance, as illustrated in FIG. 5, one half of the strip electrodes 22 may be formed in the first region 24C, and the other half may be formed in the second region 24D.

In the acoustic wave resonator 4A according to this embodiment, as illustrated in FIG. 5, the strip electrodes 22 include a first strip electrode group 22A and a second strip electrode group 22B. In FIG. 5, the strip electrodes 22 of the first strip electrode group 22A are denoted by hatching for easier visual recognition.

Here, as illustrated in FIG. 5, the strip electrodes 22 of the first strip electrode group 22A and the strip electrodes 22 of the second strip electrode group 22B are alternately formed in the propagation direction TD. Stated in another way, the strip electrodes 22 of the second strip electrode group 22B are each formed between adjacent two of the strip electrodes 22 of the first strip electrode group 22A.

In this embodiment, the acoustic wave resonator 4A is featured in a duty ratio of the strip electrodes 22. The duty ratio of the strip electrodes 22 is expressed as a value resulting from dividing a width W of certain one of the strip electrodes 22 by a pitch between the one strip electrode 22 and another adjacent strip electrode 22.

In this embodiment, the duty ratio of at least part of the strip electrodes 22 is gradually changed along the one of the opposite directions specifying the propagation direction TD. More specifically, in this embodiment, the duty ratio of at least part of the strip electrodes 22 of the first strip electrode group 22A among all the strip electrodes 22 is gradually changed along the one of the opposite directions specifying the propagation direction TD by a first change amount. The duty ratio of at least part of the strip electrodes 22 of the second strip electrode group 22B among all the strip electrodes 22 is gradually changed along the one of the opposite directions specifying the propagation direction TD by a second change amount different from the first change amount.

Generally, of acoustic waves propagating in the piezoelectric body 6, a resonance frequency of the acoustic wave excited by the acoustic wave resonator 4A varies depending on the duty ratio of the strip electrodes 22. In the acoustic wave resonator 4A, therefore, when parameters contributing to the above-mentioned resonance frequency except for the duty ratio of the strip electrodes 22 are substantially constant at any positions on the acoustic wave resonator 4A, a difference generates in the resonance frequency depending on the position on the acoustic wave resonator 4A.

The change in the duty ratio of the strip electrodes 22 in this embodiment may be given, for example, by using the change in the duty ratio of the electrode fingers 14, depicted in one of the graphs of FIG. 3, instead of the change in the duty ratio of the strip electrodes 22.

The strip electrodes 22 are arranged at a certain pitch P between adjacent two of the strip electrodes 22. A resonance frequency of an acoustic wave excited by the acoustic wave resonator 4A depends on the pitch P between the strip electrodes 22 as well.

In this embodiment, the pitch P is changed to cancel an effect of a difference in the duty ratio of the strip electrodes 22 on a difference in the resonance frequency in the electrode-finger placement region 24. Stated in another way, in the acoustic wave resonator 4A according to this embodiment, a difference between resonance frequencies oscillated at different positions in the electrode-finger placement region 24 is smaller than in the case in which the pitch P is set to be substantially constant at all the positions.

As a result, the frequencies of acoustic waves excited at different positions on the piezoelectric body 6 become more uniform, and the characteristics of the acoustic wave resonator 4A are improved. The pitch P between the strip electrodes 22 can be easily determined with a simulation from the difference in the duty ratio of the strip electrodes 22. A width and a thickness of the strip electrodes 22 may be set substantially the same as the width and the thickness of the electrode fingers 14 of the IDT electrode 8, respectively.

In the acoustic wave resonator 4A according to this embodiment, the duty ratio of the strip electrodes 22 is changed in the electrode-finger placement region 24. Stated in another way, in the acoustic wave resonator 4A according to this embodiment, a resonated spurious frequency is different depending on a position in the electrode-finger placement region 24. Accordingly, comparing with the acoustic wave resonator including the reflector that includes the strip electrodes with the constant duty ratio, the acoustic wave resonator 4A according to this embodiment can suppress resonated spurious frequencies from concentrating on a certain value and can reduce the intensity of spurious waves as a whole.

In the acoustic wave resonator 4A according to this embodiment, a difference in main resonance frequency is reduced in addition to the change in the duty ratio of the strip electrodes 22 in the electrode-finger placement region 24. Accordingly, the intensity of the spurious waves can be reduced while uniformity in the main resonance frequency is maintained. Hence the characteristics can be improved.

In the acoustic wave resonator 4A according to this embodiment, the change amount of the duty ratio of the strip electrodes 22 along the first direction T1 is different between the first strip electrode group 22A and the second strip electrode group 22B. Stated in another way, in the acoustic wave resonator 4A according to this embodiment, there is a difference in rule of the change in the duty ratio for the strip electrodes 22 adjacent to each other in the propagation direction TD.

Accordingly, in the acoustic wave resonator 4A according to this embodiment, the difference in the duty ratio can be more effectively given for the strip electrodes 22 adjacent to each other in the propagation direction TD. Moreover, in the acoustic wave resonator 4A according to this embodiment, a variation in the resonance frequency caused by the change in the duty ratio of the strip electrodes 22 can be relatively easily made more uniform with design of the pitch P between the strip electrodes 22.

ALTERNATIVE EMBODIMENTS

The above embodiments have been described in connection with the examples in which the acoustic wave resonators 4 and 4A each include the reflective multilayer film 30. However, the present disclosure is not limited to those examples. In the fixation substrate 36 in each of the acoustic wave resonators 4 and 4A, the piezoelectric body 6 may be formed directly on the support substrate 26 made of Si, or an insulating layer made of $SiO_2$, for example, may be disposed instead of the reflective multilayer film 30.

In the acoustic wave resonators 4 and 4A according to the embodiments, a gap may be formed between a rear surface of the piezoelectric body 6 in a region where the IDT electrode 8 is formed and the support substrate 26. In such a case, the acoustic wave resonators 4 and 4A according to the embodiments may be each, for example, in the so-called membrane form in which the piezoelectric body 6 is arranged over a recess formed in the support substrate 26.

<Summary of Communication Device and Duplexer>

Figure 6:
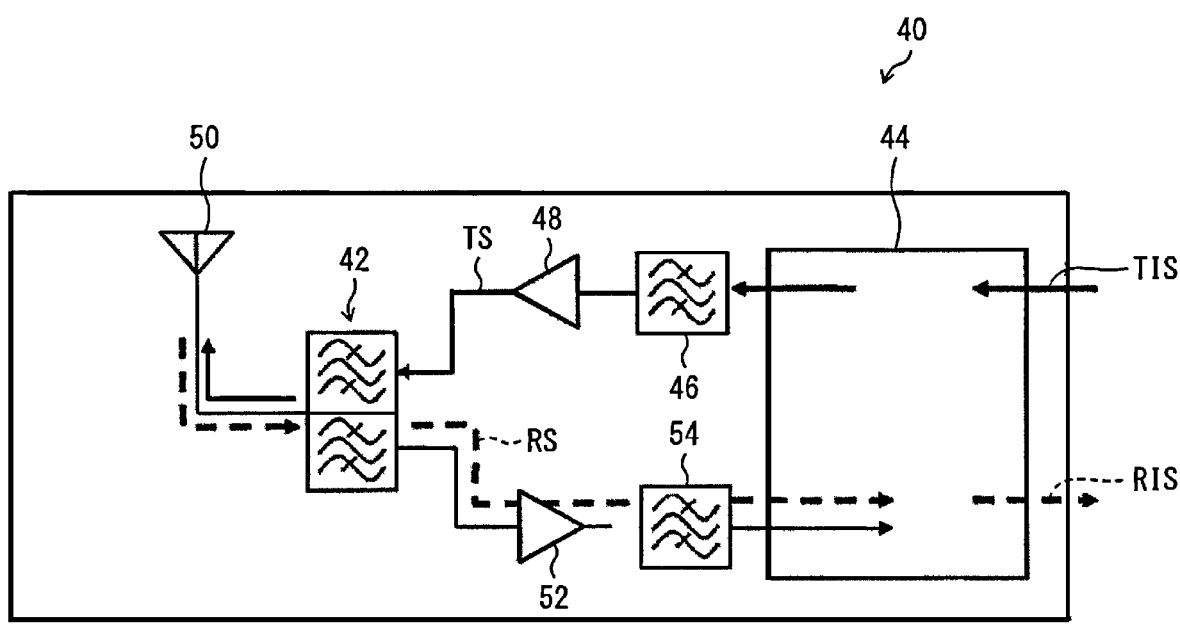
FIG. 6 is a schematic explanatory view illustrating a communication device according to an embodiment of the present disclosure.

FIG. 6 is a block diagram illustrating principal part of a communication device 40 according to an embodiment of the present disclosure. The communication device 40 performs radio communication utilizing an electric wave. A duplexer 42 has the function of selectively extracting a signal of a transmission frequency and a signal of a reception frequency in the communication device 40.

In the communication device 40, a transmission information signal TIS containing information to be transmitted is converted to a transmit signal TS through modulation and frequency step-up (conversion to a radio frequency signal of a carrier wave frequency) that are executed in an RF-IC 44. The transmit signal TS is input to a bandpass filter 46 for removing unwanted components other than a transmission passband and is then input to the duplexer 42 after amplification by an amplifier 48. The duplexer 42 removes the unwanted components other than the transmission passband from the input transmit signal TS and outputs the transmit signal TS to an antenna 50. The antenna 50 converts the input electrical signal (transmit signal TS) to a radio signal and transmits the radio signal.

In the communication device 40, a radio signal received by the antenna 50 is converted, by the antenna 50, to an electrical signal (receive signal RS) that is input to the duplexer 42. The duplexer 42 removes unwanted components other than a reception passband from the receive signal RS and outputs the receive signal RS to an amplifier 52. The output receive signal RS is amplified by an amplifier 52, and the unwanted components other than the reception passband are removed from the receive signal RS by a bandpass filter 54. Then, the receive signal RS is subjected to frequency step-down and demodulation in the RF-IC 44 for conversion to a reception information signal RIS.

The transmission information signal TIS and the reception information signal RIS may be low-frequency signals (base band signals) containing proper information, and they are, for example, analog voice signals or digitized audio signals. The passband of the radio signal may be given in accordance with suitable one of various standards, such as UMTS (Universal Mobile Telecommunications System). A modulation method may be phase modulation, amplitude modulation, frequency modulation, or a combination of two or more among those modulation.

Figure 7:
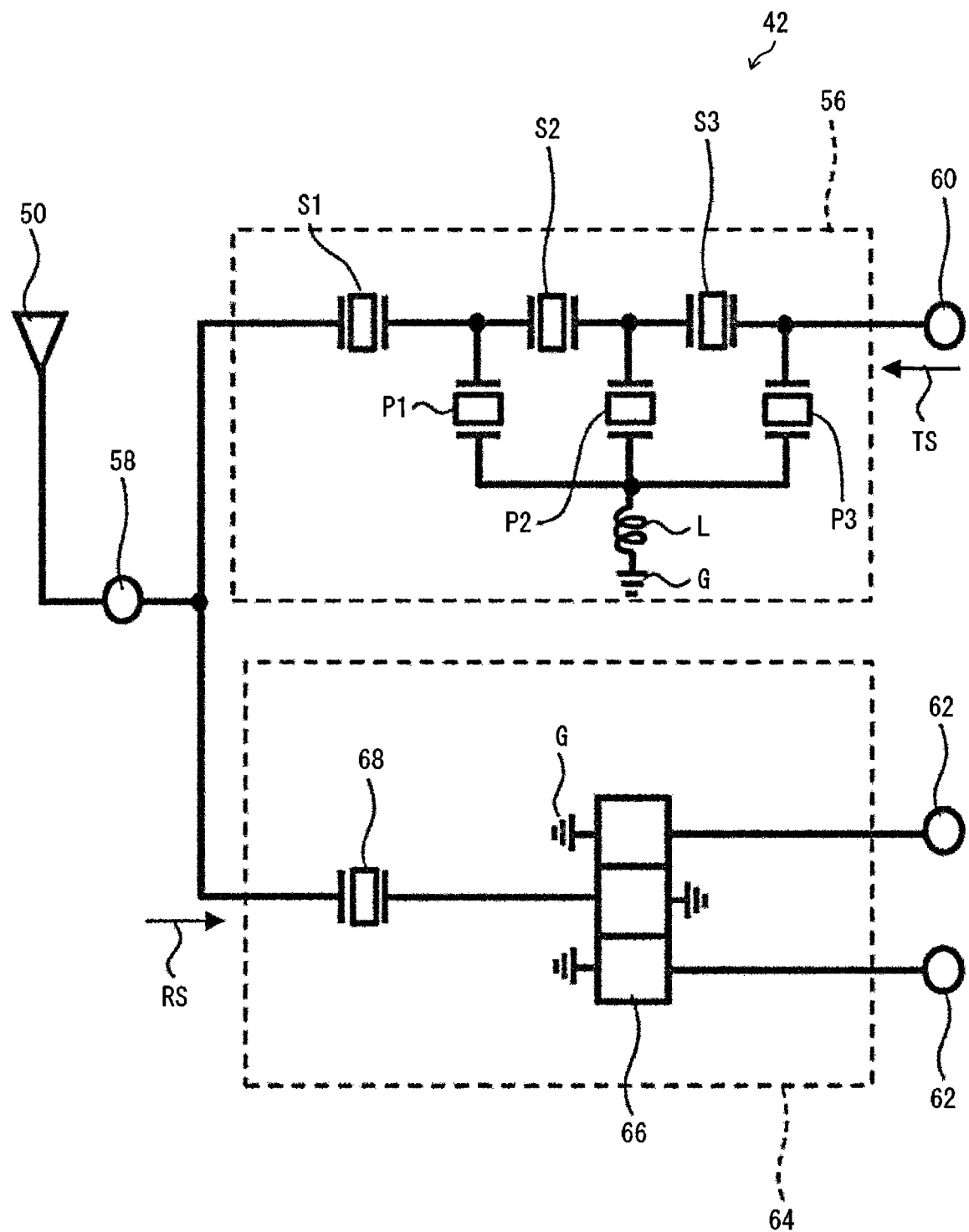
FIG. 7 is an explanatory circuit diagram illustrating a duplexer according to an embodiment of the present disclosure.

FIG. 7 is a circuit diagram illustrating a configuration of a duplexer 42 according to an embodiment of the present disclosure. The duplexer 42 is the same as the duplexer 42 used in the communication device 40 illustrated in FIG. 6.

As illustrated in FIG. 7, a transmission filter 56 includes serial resonators S1 to S3 and parallel resonators P1 to P3. The duplexer 42 is mainly composed of an antenna terminal 58, a transmit terminal 60, at least one receive terminal 62, the transmission filter 56 arranged between the antenna terminal 58 and the transmit terminal 60, and a reception filter 64 arranged between the antenna terminal 58 and the receive terminals 62. The transmit signal TS from the amplifier 48 is input to the transmit terminal 60, and the transmit signal TS input to the transmit terminal 60 is output to the antenna terminal 58 after removal of the unwanted components other than the transmission passband. The receive signal RS is input to the antenna terminal 58 from the antenna 50 and is output to the receive terminals 62 after removal of the unwanted components other than the reception passband in the reception filter 64.

The transmission filter 56 is constituted by, for example, a ladder acoustic wave filter. In more detail, the transmission filter 56 includes three serial resonators S1, S2 and S3 connected in series between an input side and an output side thereof, and three parallel resonators P1, P2 and P3 disposed between a reference potential portion G and a serial arm that is a wiring interconnecting the serial resonators. Thus, the transmission filter 56 is a three-stage ladder filter. Note that, in the transmission filter 56, the number of stages of the ladder filter is optionally selected.

An inductor L is disposed between the parallel resonators P1 to P3 and the reference potential portion G. By setting an inductance of the inductor L to a predetermined value, an attenuation pole is formed outside the passband of the transmit signal, and an out-of-band attenuation is increased. The serial resonators S1 to S3 and the parallel resonators P1 to P3 are each formed of an acoustic wave resonator.

The reception filter 64 includes, for example, a multimode acoustic wave filter 66 and an auxiliary resonator 68 connected in series to an input side of the multimode acoustic wave filter 66. In this embodiment, the term "multimode" includes a duplex mode. The multimode acoustic wave filter 66 has a balanced-unbalanced transforming function, and the reception filter 64 is connected to two receive terminals 62 from which balanced signals are output. The reception filter 64 is not limited to the multimode acoustic wave filter 66 and may be constituted by a ladder filter or a filter not having the balanced-unbalanced transforming function.

An impedance matching circuit formed of an inductor, for example, may be inserted between the ground potential portion G and a connection point at which the transmission filter 56, the reception filter 64, and the antenna terminal 58 are connected to one another.

The acoustic wave filter according to each of the above-described embodiments is used as, for example, an acoustic wave element constituting a ladder filter circuit of at least one of the transmission filter 56 or the reception filter 64 in the duplexer 42 illustrated in FIG. 6. When one of the transmission filter 56 or the reception filter 64 is the acoustic wave filter according to the above-described embodiment, all or at least some of the acoustic wave resonators included in that filter are each any of the acoustic wave resonators 4 and 4A to 4G according to the above-described embodiments.

Filter characteristics of the communication device 40 can be improved with use of the duplexer 42 including the transmission filter 56 or the reception filter 64.

The present disclosure is not limited to the above-described embodiments and can be variously modified within the scope defined in claims. Other embodiments obtained by appropriately combining the technical means disclosed in the above-described different embodiments also fall within the technical scope of the present disclosure.

REFERENCE SIGNS

2 . . . acoustic wave filter, 4, 4A to 4G . . . acoustic wave resonator, 6 . . . piezoelectric body, 8 . . . IDT electrode, 14 . . . electrode finger, 14A . . . first electrode finger group, 14B . . . second electrode finger group, 14C . . . intermediate electrode finger group, 18 . . . reflector, 24 . . . electrode-finger placement region, 24A . . . first region, 24B . . . second region, 24C . . . intermediate region, 26 . . . support substrate, 30 . . . reflective multilayer film, 38 . . . protective film, 40 . . . communication device, 42 . . . duplexer, 44 . . . RF-IC, 50 . . . antenna, 56 . . . transmission filter, 58 . . . antenna terminal, and 64 . . . reception filter.

The invention claimed is:

1. An acoustic wave resonator comprising:
a piezoelectric body; and
a plurality of electrode fingers positioned on the piezoelectric body and arrayed in a propagation direction of acoustic waves,
wherein the plurality of electrode fingers includes a first electrode finger group and a second electrode finger group of which electrode fingers are each formed between adjacent two of the electrode fingers of the first electrode finger group,
a duty ratio of the electrode fingers of the first electrode finger group is gradually changed along one of opposite directions specifying the propagation direction by a first change amount, and a duty ratio of the electrode fingers of the second electrode finger group is gradually changed in the one of the opposite directions specifying the propagation direction by a second change amount different from the first change amount, and
in a region in which the plurality of electrode fingers is positioned, a pitch between the electrode fingers is changed to cancel an effect of a difference in the duty ratio of the electrode fingers on a difference in resonance frequency.

2. The acoustic wave resonator according to claim 1, wherein resonance frequencies of the acoustic waves in a main mode are same in 80% or more of the region in which the plurality of electrode fingers is positioned.

3. The acoustic wave resonator according to claim 1, wherein the region in which the plurality of electrode fingers is positioned includes a first region in which the duty ratio of the electrode fingers of the first electrode finger group increases gradually along a first direction that is the one of the opposite directions specifying the propagation direction, and a second region in which the duty ratio of the electrode fingers of the first electrode finger group decreases gradually along the first direction.

4. The acoustic wave resonator according to claim 3, wherein, in the first region, the duty ratio of the electrode fingers of the second electrode finger group increases gradually along the first direction, and in the second region, the duty ratio of the electrode fingers of the second electrode finger group decreases gradually along the first direction.

5. The acoustic wave resonator according to claim 3, wherein, in the first region, the duty ratio of the electrode fingers of the second electrode finger group decreases gradually along the first direction, and in the second region, the duty ratio of the electrode fingers of the second electrode finger group increases gradually along the first direction.

6. The acoustic wave resonator according to claim 1, wherein a difference between a maximum value and a minimum value of the duty ratio of the electrode fingers of the first electrode finger group is different from a difference between a maximum value and a minimum value of the duty ratio of the electrode fingers of the second electrode finger group.

7. The acoustic wave resonator according to claim 1, wherein a maximum value of the duty ratio of the electrode fingers of the first electrode finger group is different from a maximum value of the duty ratio of the electrode fingers of the second electrode finger group.

8. The acoustic wave resonator according to claim 1, wherein a minimum value of the duty ratio of the electrode fingers of the first electrode finger group is different from a minimum value of the duty ratio of the electrode fingers of the second electrode finger group.

9. The acoustic wave resonator according to claim 1, wherein a maximum value of the duty ratio of the electrode fingers of the first electrode finger group is greater than a maximum value of the duty ratio of the electrode fingers of the second electrode finger group, and
a minimum value of the duty ratio of the electrode fingers of the first electrode finger group is smaller than a minimum value of the duty ratio of the electrode fingers of the second electrode finger group.

10. The acoustic wave resonator according to claim 1, further comprising, on the piezoelectric body, an IDT electrode including at least part of the plurality of electrode fingers.

11. The acoustic wave resonator according to claim 1, further comprising, on the piezoelectric body,
an IDT electrode including at least one part of the plurality of electrode fingers, and
a pair of reflectors positioned at opposite end sides in the propagation direction relative to the IDT electrode, each of the pair of reflectors including another part of the plurality of electrode fingers.

12. The acoustic wave resonator according to claim 10, wherein the IDT electrode includes a first busbar and a second busbar positioned opposite to the first busbar, and
at least part of the electrode fingers of the first electrode finger group extends from the first busbar, and at least part of the electrode fingers of the second electrode finger group extends from the second busbar.

13. The acoustic wave resonator according to claim 1, wherein a thickness of the piezoelectric body is equal to or smaller than a pitch between any adjacent two of the electrode fingers.

14. An acoustic wave filter comprising at least one or more acoustic wave resonators each according to claim 1.

15. A duplexer comprising:
an antenna terminal;
a transmission filter that performs filtering on a transmit signal and outputs the transmit signal to the antenna terminal; and
a reception filter that performs filtering on a receive signal from the antenna terminal,
wherein at least one of the transmission filter or the reception filter includes the acoustic wave filter according to claim 14.

16. A communication device comprising:
an antenna;
the duplexer according to claim 15, the antenna terminal of the duplexer being connected to the antenna; and
an IC connected to the transmission filter and the reception filter.

* * * * *